United States Patent [19]

Maya

[11] Patent Number: 4,833,034
[45] Date of Patent: May 23, 1989

[54] CARBONACEOUS FILM COATING

[75] Inventor: Leon Maya, Oak Ridge, Tenn.

[73] Assignee: The United States of America as represented by the United States Department of Energy, Washington, D.C.

[21] Appl. No.: 186,427

[22] Filed: Apr. 26, 1988

[51] Int. Cl.$^4$ ............................................. C23C 16/26
[52] U.S. Cl. ................................... 428/408; 427/228; 427/255.5
[58] Field of Search ................. 428/408; 427/70, 228, 427/227, 226, 255.5

[56] References Cited

U.S. PATENT DOCUMENTS

| | | | |
|---|---|---|---|
| 4,526,673 | 7/1985 | Little et al. | 204/192 E |
| 4,686,116 | 8/1987 | Rickborn et al. | 427/255 |
| 4,752,504 | 6/1988 | Rickborn | 427/255.5 X |

OTHER PUBLICATIONS

Adams; Electrochemical Scoiety, Jun. 1981, vol. 128, No. 6, 1378–1379.
Beyer et al., "Boron–Nitrogen Compounds, VIII.$^{1,2}$, 2-Dimethylamino-1,3,2-benzsodiazaboroline," J. Org. Chem. 27, 4701, (1962).
Niedenzu et al., "Zeitschrift Fur Anorganische Und Allgemeine Chemie," 1965.
Mort et al., "Plasma Deposited Thin Films," CRC Press, Inc. 1986.
Kovetakis et al., "A Novel Graphite–Like Material of Composition $BC_3$, and Nitrogen–Carbon Graphites," J. Chem. Soc., Chem. Commun., 1986.
C. Beny-Bassez et al., "Characterization of Carbonaceous Materials by Correlated Electron and Optical Microscopy and Raman Microspectroscopy," Scanning Electron Microscopy/1985/I, pp. 119–132.
Kaner et al., "Boron–Carbon–Nitrogen Materials of Graphite–Like Structure," Mat. Res. Bull., vol. 22, pp. 399–404, 1987.
Maya, "Aminoborane Polymers as Precursors of Ceramic Materials," Chemistry Division, Oak Ridge National Lab., Oak Ridge, Tenn.

Primary Examiner—Nancy Q. B. Swisher
Attorney, Agent, or Firm—Stephen D. Hamel; William R. Moser

[57] ABSTRACT

A method of making a carbonaceous film comprising heating tris(1,3,2-benzodiazaborolo)borazine or dodecahydro tris[1,3,2]diazaborine[1,2-a:1'2'-c:1"2"-e]borazine in an inert atmosphere in the presence of a substrate to a temperature at which the borazine compound decomposes, and the decomposition products deposit onto the substrate to form a thin, tenacious, highly reflective conductive coating having a narrow band gap which is susceptible of modification and a relatively low coefficient of friction.

7 Claims, 1 Drawing Sheet

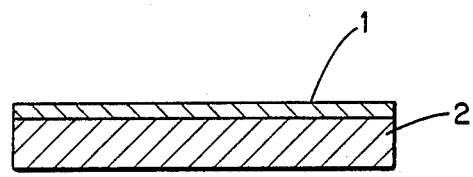

CARBONACEOUS FILM COATING

This invention relates to methods of making thin films by depositing components of the film onto a substrate, and more particularly, to methods of depositing thin carbonaceous films onto substrates. The Government has rights in this invention pursuant to Contract No. DE-AC05-84OR21400 awarded by the U.S. Department of Energy.

BACKGROUND OF THE INVENTION

Thin carbonaceous films are important in an variety of applications, such as, for example, electronic devices, electronic packaging, optics, lasers and coatings on tools. As a result, there has been considerable research on methods of making carbonaceous films. Such films have been produced by methods such as: evaporating carbon which is collected on a substrate; forming a plasma for deposition onto a substrate; and chemical vapor deposition techniques. Some of the carbon coatings are known to be semiconductors; however, typically they are characterized by a relatively wide band gap. Some of the carbonaceous coatings do not adhere well to a desired substrate, and some of the coatings are not suitable for use in chemically-aggressive environments.

SUMMARY OF THE INVENTION

It is accordingly one object of this invention to provide a method for making a carbonaceous film which has excellent physical properties.

It is another object of this invention to provide a thin film which has a relatively narrow band semiconductance.

It is still another object of this invention to provide an article which is coated with a thin carbonaceous film.

In accordance with this invention there is provided a method of depositing a carbonaceous film onto a substrate comprising contacting said substrate in an inert atmosphere with pyrolysis products of a polycyclic aromatic or aliphatic compound containing nitrogen and boron in at least one cyclic ring. According to the invention, there are also provided (1) a film which is formed by contacting a substrate with the pyrolysis products of such a polycyclic aromatic or aliphatic compound and, (2) an article which is coated with such a film.

BRIEF DESCRIPTION OF THE FIGURE

The FIGURE is a representation of a substrate 2 covered with a film 1 made in accordance with the present invention.

DETAILED DESCRIPTION OF THE INVENTION

In carrying out this invention, a polycyclic aromatic or aliphatic compound containing boron and nitrogen is heated in an inert atmosphere, in the presence of a substrate, to a temperature at which the polycyclic compound decomposes. The invention will be described in detail by a method in which the aromatic polycyclic compound is tris(1,3,2-benzodiazaborolo)borazine (referred to herein as the aromatic borazine compound) and the aliphatic polycyclic compound is dodecahydro tris[1,3,2]diazaborine]1,2-a:1'2'-C:1"2"-e]borazine referred to herein as the aliphatic borazine compound. Methods of making these borazine compounds have been described in the prior art. See for example, Beyer et al, *J. Org. Chem.*, 27, 4701 (1962) for methods of making the aromatic borazine compound and K. Niedinzy et al Z., *An Org. Allg. Chem.* 340 329 (1965) for methods of preparing the aliphatic borazine compound.

In carrying out this invention, the borazine compound is placed in a reaction vessel which contains the desired substrate material, the vessel is evacuated or is supplied with an inert atmosphere, and the vessel and its contents are heated to a temperature high enough to decompose the borazine compound.

The vessel can be any material which is capable of withstanding the high temperatures involved, such as, for example, quartz.

A variety of shapes of substrates may be coated with this process, and the substrate material is typically limited only by the need to withstand the temperature at which the borazine compound decomposes. Typically useful substrates are quartz, titanium, silicon and stainless steel.

Although the present invention may be carried out in the presence of an inert gas, in the preferred method of carrying out the invention, the vessel is evacuated and sealed under a vacuum, for example, under a vacuum of about $10^{-3}$ Torr.

In carrying out the invention, the pyrolytic decomposition products of the borazine compound may plate out on substantially all surfaces within the vessel, including the vessel walls, as well as on a target substrate. The coating thickness is variable with the amount of borazine compound used for a given surface area, but the correlation between amount of borazine introduced and the coating thickness may be limited. Conditions for a specific thickness may be determined by routine experimentation.

The temperature used must be high enough to pyrolytically decompose the borazine compound, and a temperature of about 800° C. has been found to be satisfactory. Higher temperatures serve no purpose and may be detrimental as they approach temperatures which modify the film which is deposited or damage the substrate or the vessel in which the reaction is taking place.

The carbonaceous film found by pyrolizing the borazine compound comprises, by weight, 40–65% carbon, 20–40% nitrogen, 10–20% boron, 1–10% oxygen, and 0.5–2% hydrogen.

Pyrolysis of the aromatic borazine compound typically produces about 15% volatiles (based on the initial weight), primarily ammonia, methane, hydrogen and traces of benzene.

A typical carbonaceous film formed from the aromatic borazine compound will contain about 64–65% carbon, 23–24% nitrogen, 11% boron and 0.5 to 1% hydrogen.

The aliphatic borazine produces a residue containing about 65% of the initial weight. The volatiles produced in the pyrolysis are: hydrogen, methane, ammonia and hydrogen cyanide. The composition of the residue is calculated to be about 39% carbon, 40% nitrogen, 20% boron and 1% hydrogen.

The film which results, which may have a thickness of several microns, is highly reflective, adheres well to the substrate, is hard, relatively inert, exhibits a low coefficient of friction, is of an amorphous nature, and behaves as a narrow band semiconductor.

It has been discovered that titanium appears to act as a scavenger of the volatile species, possible forming carbide(s), hydride(s) and nitride(s).

Having thus described the invention, the following examples are offered to illustrate it in more detail.

EXAMPLE I

Tris(1,3,2-benzodiazaborolo)borazine was prepared by adding 25 grams of tris(dimethylamino)borane to a solution of 18.9 grams of o-phenylene diamine in 150 ml. of xylene. The reaction mixture was heated and refluxed for 18 hours under a stream of argon and was then cooled and filtered. The crude solid, 13.5 grams, was recrystallized from acetone to yield white, shiny needles having a melting point of 400° C. The calculated weight percents for the elements in $C_{18}H_{15}N_6B_3$ are: carbon-62.2%; hydrogen-4.32%; nitrogen-24.2%; and, boron-9.33%. Analysis of the product showed that these elements were present in the following amounts: carbon-62.39%; hydrogen-4.43%; nitrogen-24.12%; and, boron-9.41%. The preparation can be described by the following equation:

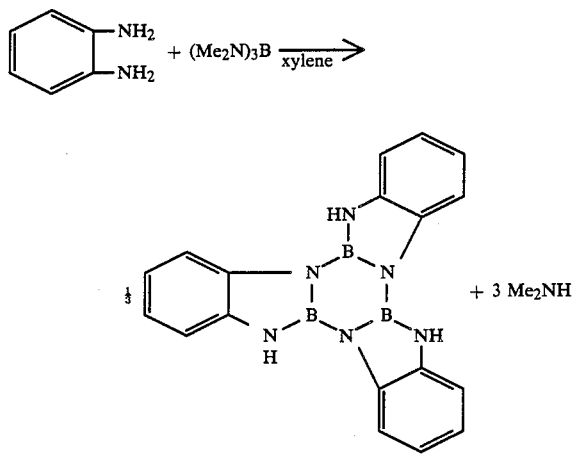

EXAMPLE II

An aliphatic borazine was prepared through the condensation of tris(dimethylamino)borane and 1,3 diamino propane. A 16.6 gram portion of the former was introduced into a flask containing 150 ml. toluene. The resulting solution was then treated with 9.0 grams of 1,3 diamino propane. The mixture was refluxed for 4.5 hours. The solvent was the removed by distillation and the residue, 8.0 grams, was purified by sublimation to produce the aliphatic borazine. The structure of this compound is as follows:

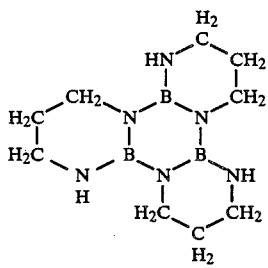

EXAMPLE III

The borazine compound made in Example I was placed in a quartz reaction vessel in which a substrate material was suspended. The vessel was sealed under a vacuum of $10^{-3}$ Torr, and the vessel and its contents were heated to about 800° C. and held at that temperature for about 30 minutes. The borazine compound decomposed and decomposition products plated out on the vessel walls and the substrate surfaces. Substrates comprising quartz, titanium and silicon plates were coated on both sides by suspending them vertically in the vessel. A stainless steel ball suspended in the vessel was coated only on the hemisphere facing the bottom of the vessel.

Visual observations during pyrolysis showed that the aromatic borazine compound melted at about 400° C. to produce a colorless liquid, which remained colorless even after standing for 1 hour at 500° C. Heating to 600° C. produced a pale yellow coloration, and at 650° C. a yellowish coating covered all inside surfaces. The color of the coating intensified at 700° C. and very little residue could be observed at the bottom of the vessel. Following pyrolysis, the samples were removed from the vessel and the coatings were analyzed for physical, chemical and electrical properties. The coating was a few microns thick and the density as determined by weight and volume of coated quartz plates was about 2.07. This is relatively high for a carbonaceous coating. The coefficient of friction of stainless steel against the coating on quartz was measured at 0.2 compared with 0.8 on uncoated quartz. The coating exhibited a tenacious adherence to the substrates, and the visual appearance was smooth, highly reflective and metallic.

The coating was compared with other carbonaceous, graphite-like and diamond-like coatings which were deposited by ion beam and plasma methods. Using density measurements and chemical analysis, the comparison was based on the relationship between the gram atom number density and the atom fraction of hydrogen as set forth in the chapter entitled "Carbon Thin Films" by Angus et al in *Plasma Deposited Thin Films*, Mont and Jansen, Eds., CRC Press, Inc., 1986. This relationship is:

$$N = \frac{M}{x_i A_i}$$

where N is the gram atom number density, M is the mass density, $x_i$ is the atom fraction and $A_i$ is the atomic mass of element i. According to this relationship, the coatings obtained by the present process are closer to graphite than to the diamond-like films which are denser and richer in hydrogen.

Raman spectra were obtained from the coatings on titanium, silicon and quartz. A spectrum was also obtained from the coating on quartz that was subjected to chemical treatment in acid. In all cases, the spectra comprised two bands at 1350 and 1595 cm$^{-1}$, which are typical of the Raman spectra of carbonaceous materials. The only noticeable effect of chemical treatment, as for example with $H_2SO_4$-$HNO_3$, was enhancement of the intensity of the two bands. Single crystals of graphite produce a sharp single band at 1575 cm$^{-1}$. In addition, a band at 1355 cm$^{-1}$ appears for other materials such as activated carbon, lampblack, vitreous carbon and commercial graphite. The 1575 cm$^{-1}$ band was identified as the $E_{2g}$ mode while the 1355 cm$^{-1}$ band was attributed to a particle size effect. The 1350 cm$^{-1}$ band is known to be related to defects such as heteroatoms, tetrahedral carbons or misaligned units. These defects can be removed by heat treatment of graphitizable carbons but cannot be removed from non-graphitizable materials.

It appears that the coatings prepared in the present process could be classified as non-graphitizable carbonaceous materials, which, on the basis of their chemical composition, contain a significant amount of heteroatoms. This is supported not only by the presence of the 1350 cm$^{-1}$ band in the Raman spectra, but also by additional X-ray diffraction, transmission electron microscopy (TEM), and electron spectroscopy for chemical analysis (ESCA).

The X-ray powder diffraction of material scraped from coatings showed darkening of the film typical of an amorphous substance. Direct examination of intact coatings on silicon and titanium showed the following results. The coating on silicon produced broad lines corresponding to d spacings of 6.12 and 2.07 A. An additional line with d=3.44 A could be observed using a grazing angle technique that eliminated diffraction from the substrate; however, under these conditions the 2.07 line was no longer discernible, and the 6.12 line shifted to 6.42 A.

In the case of titanium the lines were also broad. Distinct lines were observed at 3.64, 2.49 and 2.15 A and a very shallow signal at 6.4 A. Use of a grazing angle brought up the intensity of the 6.4 line while the maximum of the second line appeared at 3.5 A. The lines at 2.49 and 2.15 on titanium appear to be due to TiN. The lines at a value of 3.5 might arise from a distorted graphite structure that departs from the normal graphite structure which has an interlayer specing of 3.35 A. The line at 6.4 A may be due to a boron nitride modification.

Transmission electron microscopy on material scraped from quartz showed that most of it was amorphous. However, a few areas contained crystalline material, diffraction patterns being identified as hexagonal BN, an intermediate polymorphic BN between cubic and hexagonal, $B_{25}N$ tetragonal and possibly graphite and $HBO_2$. The presence of $HBO_2$ is not certain because while some of the d-spacings agreed quite well with those reported for this material, stronger lines were missing. The indication that cubic BN and an intermediate BN polymorph were present, detected both in the X-ray and electron diffraction, is quite suggestive of very strong compressive forces acting on microcrystallites as the film solidified.

ESCA was performed on the coating deposited on quartz and on a similar specimen after chemical treatment with $H_2SO_4$-$HNO_3$. Spectra were obtained using Al K radiation at 250 watts. Additional spectra were collected from each specimen after sputtering with a 4 kV, 0.07 ma/cm$^2$ argon ion beam for a 20 minute period. The signal due to the C (1s) level was relatively simple. It peaked at 284.6 eV, consistent with the typical energy of graphite and most hydrocarbons. The chemical treatment produced oxidation as evidenced by a broader signal with a 288 eV component, but sputtering eliminated the oxidized species, thus suggesting that the extent of chemical attack was limited to a relatively shallow depth.

The B (1s) level could not be observed on the "as deposited" coating, apparently because of lack of sensitivity, since the cross-section for boron is smaller. It is possible that the boron-containing moieties are embedded in the carbon matrix and are not readily accessible. This is supported by the fact that boron as boron nitride was evident in the oxidized film by the presence of a signal at 190.2 eV. The chemical treatment apparently caused exposure of a deeper layer. As in the case of carbon, evidence of oxidized boron species was also observed, but these diminished in intensity as a result of sputtering.

The electrical conductivity of the film was smaller by a factor of about 50 than that of vitreous carbon and larger by a factor of 600 than that of some graphite-like C-B-N materials.

The friction coefficient of the as-deposited film on quartz was measured at room temperature in a nitrogen atmosphere using a 100 g load on a 316 stainless steel ball. The average value for the coefficient was 0.14 with a range of 0.11 to 0.19 that incorporates the forward and reverse directions during a 60 minutes test period. The corresponding values for an uncoated quartz plate tested under similar conditions were 0.81 with a range of 0.79 to 0.83. It is seen that the coating improves the sliding characteristics of the substrate and gives a friction coefficient similar to that of diamond-like coatings.

Measurements of the microhardness of the film deposited on quartz proved to be unfeasible because the material behaved elastically. The coating is evidently hard since it did not deform plastically under the conditions of a hardness test that reached an average mean pressure of 2.9 GPa. The Young modulus of the film was 20 GPa which is about the same as that of vitreous carbon.

What is claimed is:

1. A method of depositing a carbon-nitrogen-boron film onto a substrate comprising contacting said substrate in an inert atmosphere with a polycyclic aromatic or aliphatic compound, said compound containing borazine in at least one cyclic ring, pyrolyzing said compound to form a carbon-nitrogen-boron film on said substrate.

2. The method according to claim 1 wherein said polycyclic compound comprises tris(1,3,2-benzodiazaborolo)borazine or an aliphatic derivative of borazine.

3. A method in accordance with claim 2 wherein the contact of said substrate with said pyrolysis products is made in the presence of titanium, whereby titanium scavenges volatiles and thus reduces the pressure of the inert atmosphere.

4. A carbonaceous film deposited by the process of contacting a substrate in an inert atmosphere with pyrolysis products of tris(1,3,2-benzodiazaborolo)borazine or an aliphatic derivative of borazine.

5. A carbonaceous film comprising by weight about 40-65% carbon, 30-40% nitrogen, 10-20% boron, 1-10% oxygen, and 0.5 to 2% hydrogen.

6. A carbonaceous film in accordance with claim 5, wherein said film behaves as a semiconductor with a narrow band gap, and said band gap is susceptible to modification by chemical treatment.

7. An article comprising a substrate coated with pyrolytic decomposition products of tris(1,3,2-benzodiazaborolo)borazine or an aliphatic derivative of borazine.

* * * * *